US009590569B2

(12) United States Patent
Thompson et al.

(10) Patent No.: US 9,590,569 B2
(45) Date of Patent: Mar. 7, 2017

(54) SYSTEMS, CIRCUITS AND METHODS RELATED TO LOW POWER EFFICIENCY IMPROVEMENT IN MULTI-MODE MULTI-BAND POWER AMPLIFIERS

(71) Applicant: SKYWORKS SOLUTIONS, INC., Woburn, MA (US)

(72) Inventors: Philip H. Thompson, Cedar Rapids, IA (US); Michael Lynn Gerard, Cedar Rapids, IA (US); Ramanan Bairavasubramanian, Hiawatha, IA (US); David Anthony Sawatzky, Lisbon, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/704,890

(22) Filed: May 5, 2015

(65) Prior Publication Data
US 2016/0028353 A1 Jan. 28, 2016

Related U.S. Application Data

(60) Provisional application No. 61/989,439, filed on May 6, 2014.

(51) Int. Cl.
H03F 1/14 (2006.01)
H03F 3/68 (2006.01)
(Continued)

(52) U.S. Cl.
CPC ............. *H03F 1/56* (2013.01); *H03F 3/19* (2013.01); *H03F 3/211* (2013.01); *H03F 3/245* (2013.01); *H03F 2200/108* (2013.01); *H03F 2200/111* (2013.01); *H03F 2200/387* (2013.01); *H03F 2200/411* (2013.01); *H03F 2200/414* (2013.01); *H03F 2200/421* (2013.01);
(Continued)

(58) Field of Classification Search
CPC .......... H03F 3/72; H03F 1/0261; H03F 3/217; H03F 2200/451; H03F 2203/7215; H03F 2200/411; H03F 3/68; H03H 11/30; G05F 1/565; H03G 3/30; H02M 3/1584; Y10T 307/406
USPC ............... 330/51, 296, 297, 124 R, 126, 295
See application file for complete search history.

(56) References Cited

U.S. PATENT DOCUMENTS

| 2012/0056677 | A1* | 3/2012 | Zhu | H03F 1/0233 330/296 |
| 2014/0220910 | A1* | 8/2014 | Jia | H03G 3/3042 455/78 |
| 2015/0050901 | A1* | 2/2015 | Lee | H03F 1/0277 455/127.3 |

* cited by examiner

Primary Examiner — Steven J Mottola
Assistant Examiner — Hafizur Rahman
(74) Attorney, Agent, or Firm — Chang & Hale LLP

(57) ABSTRACT

Systems, circuits and methods related to low power efficiency improvement in multi-mode multi-band power amplifiers. In some embodiments, a power-amplifier (PA) system can include a first amplification path having one or more PAs configured to generate a high power radio-frequency (RF) signal from an input RF signal when in a high power mode. The PA system can further include a second amplification path having one or more PAs configured to generate a low power RF signal from the input RF signal when in a low power mode. The PA system can further include a switching circuit coupled to the first amplification path and the second amplification path. The switching circuit can be configured to allow amplification of the input RF
(Continued)

signal through the first amplification path in the high power mode or the second amplification path in the low power mode.

17 Claims, 11 Drawing Sheets

(51) Int. Cl.
  *H03F 1/56* (2006.01)
  *H03F 3/21* (2006.01)
  *H03F 3/19* (2006.01)
  *H03F 3/24* (2006.01)
(52) U.S. Cl.
  CPC .... *H03F 2200/451* (2013.01); *H03F 2200/54* (2013.01); *H03F 2203/21109* (2013.01); *H03F 2203/21145* (2013.01); *H03F 2203/21175* (2013.01)

US 9,590,569 B2

SYSTEMS, CIRCUITS AND METHODS RELATED TO LOW POWER EFFICIENCY IMPROVEMENT IN MULTI-MODE MULTI-BAND POWER AMPLIFIERS

CROSS-REFERENCE TO RELATED APPLICATION(S)

This application claims priority to U.S. Provisional Application No. 61/989,439 filed May 6, 2014, entitled SYSTEMS, CIRCUITS AND METHODS RELATED TO LOW POWER EFFICIENCY IMPROVEMENT IN MULTI-MODE MULTI-BAND POWER AMPLIFIERS, the disclosure of which is hereby expressly incorporated by reference herein in its entirety.

BACKGROUND

Field

The present disclosure relates to multi-mode multi-band power amplifiers.

Description of the Related Art

A multi-mode multi-band (MMMB) power amplifier (PA) system can be configured to amplify radio-frequency (RF) signals associated with a plurality of bands. For some or all of such RF signals, the PA system can be configured to provide a plurality of amplification levels, such as high power and low power level.

SUMMARY

According to a number of implementations, the present disclosure relates to a power-amplifier (PA) system that includes a first amplification path having one or more PAs configured to generate a high power radio-frequency (RF) signal from an input RF signal when in a high power mode. The PA system further includes a second amplification path having one or more PAs configured to generate a low power RF signal from the input RF signal when in a low power mode. The PA system further includes a switching circuit coupled to the first amplification path and the second amplification path. The switching circuit is configured to allow amplification of the input RF signal through the first amplification path in the high power mode or the second amplification path in the low power mode.

In some embodiments, the switching circuit can include a first pole coupled to the first amplification path to receive the high power RF signal, and a second pole coupled to the second amplification path to receive the low power RF signal. The switching circuit can further include one or more output paths. The switching circuit can be configured to allow the first pole to be connected to a selected one of the one or more output paths when in the high power mode, and to allow the second pole to be connected to the selected one of the one or more output paths when in the low power mode. The one or more output paths can include a plurality of output paths corresponding to a plurality of operating bands. The plurality of operating bands can include, for example, some or all of 3G Band I, Band II, and Band IV.

In some embodiments, the PA system can further include a matching circuit implemented along each of the first amplification path and the second amplification path, with the matching circuit being between the one or more PAs and the switching circuit. The first amplification path can include a driver stage and a final stage arranged in series, with the driver stage configured to partially amplify the input RF signal, and the final stage configured to further amplify the partially amplified RF signal to yield the high power RF signal. The matching circuit along the first amplification path can be implemented between the final stage and the switching circuit. The matching circuit can be configured to provide a wideband matching functionality.

In some embodiments, the second amplification path can include a common stage of the first amplification path, such that the common stage is enabled in both of the high power mode and the low power mode. The common stage can include the driver stage or the first amplification path. The second amplification path can include the driver stage and a bypass path between an output of the driver stage and the switching circuit, such that the low power RF signal is substantially the partially amplified RF signal from the driver stage. The PA system can further include an impedance inverter circuit along the bypass path. The impedance inverter circuit can be configured to provide a high impedance in the bypass path for the partially amplified RF signal when in the high power mode, and to provide a desired impedance in the bypass path when in the low power mode.

The switching circuit can be configured to connect the second pole to an AC grounding path when in the high power mode. The AC grounding path can be connected to a grounding pole in the switching circuit. The AC grounding path can be connected to a grounding throw in the switching circuit.

The switching circuit can be configured to connect the second pole to the selected one of the one or more output paths through a corresponding throw when in the low power mode. The switching circuit can be configured so that the first pole is in an open state when in the low power mode.

The switching circuit can be configured to connect the second pole to the selected one of the one or more output paths through the first pole when in the low power mode. The matching circuit of the first amplification path can be configured to provide a high impedance for the low power RF signal at the first pole when in the low power mode. The final stage of the first amplification path can be disabled when in the low power mode.

In some embodiments, the second amplification path does not share a common stage with the first amplification path. The second amplification path can include a separate amplification path having an amplification stage configured to amplify the input RF signal to yield the low power RF signal.

The switching circuit can be configured to connect the first pole to the selected one of the one or more output paths through a corresponding throw when in the high power mode. The switching circuit can be configured so that the second pole is in an open state when in the high power mode. The amplification stage of the second amplification path can be configured to be disabled in the high power mode.

The switching circuit can be configured to connect the second pole to the selected one of the one or more output paths through a corresponding throw when in the low power mode. The switching circuit can be configured so that the first pole is in an open state when in the low power mode. Each of the driver stage and the final stage of the first amplification path can be configured to be disabled in the low power mode.

According to some teachings, the present disclosure relates to a method for amplifying a radio-frequency (RF) signal. The method includes routing an input RF signal through a first amplification path having one or more PAs to generate a high power RF signal when in a high power mode. The method further includes routing the input RF signal through a second amplification path having one or more PAs to generate a low power RF signal when in a low power mode. The method further includes performing a switching operation to allow amplification of the input RF signal through the first amplification path in the high power mode or the second amplification path in the low power mode.

In some implementations, the present disclosure relates to a power-amplifier (PA) module that includes a packaging substrate configured to receive a plurality of components, and a power amplifier (PA) system implemented on the packaging substrate. The PA system includes a first amplification path having one or more PAs configured to generate a high power radio-frequency (RF) signal from an input RF signal when in a high power mode, and a second amplification path having one or more PAs configured to generate a low power RF signal from the input RF signal when in a low power mode. The PA system further includes a switching circuit coupled to the first amplification path and the second amplification path. The switching circuit is configured to allow amplification of the input RF signal through the first amplification path in the high power mode or the second amplification path in the low power mode.

In some embodiments, the one or more PAs of the first amplification path, the one or more PAs of the second amplification path, and the switching circuit can be implemented on a common semiconductor die. In some embodiments, the one or more PAs of the first amplification path and the one or more PAs of the second amplification path can be implemented on a first semiconductor die, and the switching circuit can be implemented on a second semiconductor die.

In a number of implementations, the present disclosure relates to a wireless device that includes a transceiver configured to process RF signals, and an antenna in communication with the transceiver and configured to facilitate transmission of an amplified RF signal. The wireless device further includes a power amplifier (PA) system in communication with the transceiver. The PA system is configured to generate a high power RF signal or a low power RF signal as the amplified RF signal. The PA system includes a first amplification path having one or more PAs configured to generate the high power RF signal from an input RF signal when in a high power mode, and a second amplification path having one or more PAs configured to generate the low power RF signal from the input RF signal when in a low power mode. The PA system further includes a switching circuit coupled to the first amplification path and the second amplification path. The switching circuit is configured to allow amplification of the input RF signal through the first amplification path in the high power mode or the second amplification path in the low power mode.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Described herein are non-limiting examples of systems, circuits and methods related to low power efficiency improvement in multi-mode multi-band (MMMB) power amplifiers (PAs). Although described in the context of MMMB applications, it will be understood that one or more features of the present disclosure can also be implemented in other PA applications.

To minimize or reduce overall current drain in a linear PA (e.g., a PA used in 3G and 4G systems), it is typically advantageous to provide reduced power dissipation at low output powers (e.g., <10 dB below a maximum rated output power). Techniques such as stage bypass and stage bypass using a low power PA can be implemented; however, such techniques usually involve additional circuit complexity that typically involves adding a switch function at the output of the PA, and can also result in compromised performance.

Figure 1:
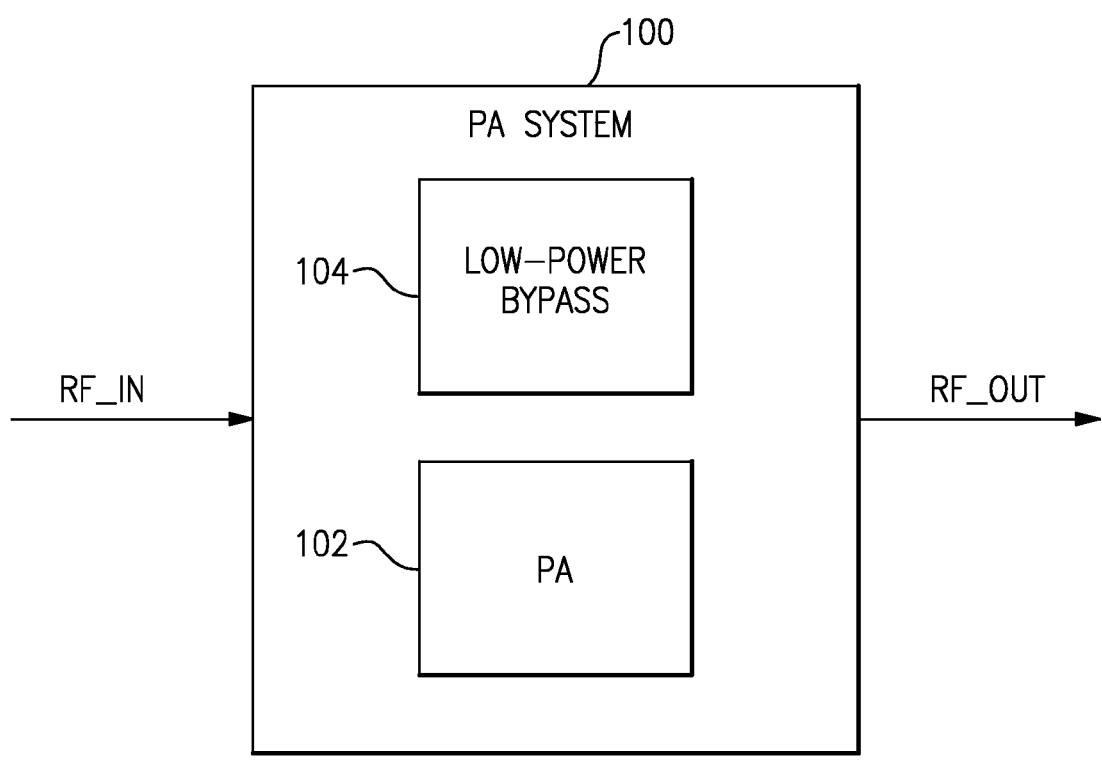
FIG. 1 shows a block diagram of a power amplifier (PA) system having a PA circuit and a low power bypass circuit configured to provide one or more advantageous functionalities as described herein.

FIG. 1 shows a block diagram of a PA system 100 having a PA circuit 102 and a low power bypass circuit 104 configured to provide one or more advantageous functionalities as described herein. The PA system 100 is shown to receive an input radio-frequency (RF) signal (RF_IN) and generate an amplified RF signal (RF_OUT). As described herein, such an output RF signal can include a low power RF signal generated in an efficient manner, at least in part by the bypass circuit 104. In various examples described herein, it is assumed that a bypass amplification path is a low power amplification path.

Figure 2:
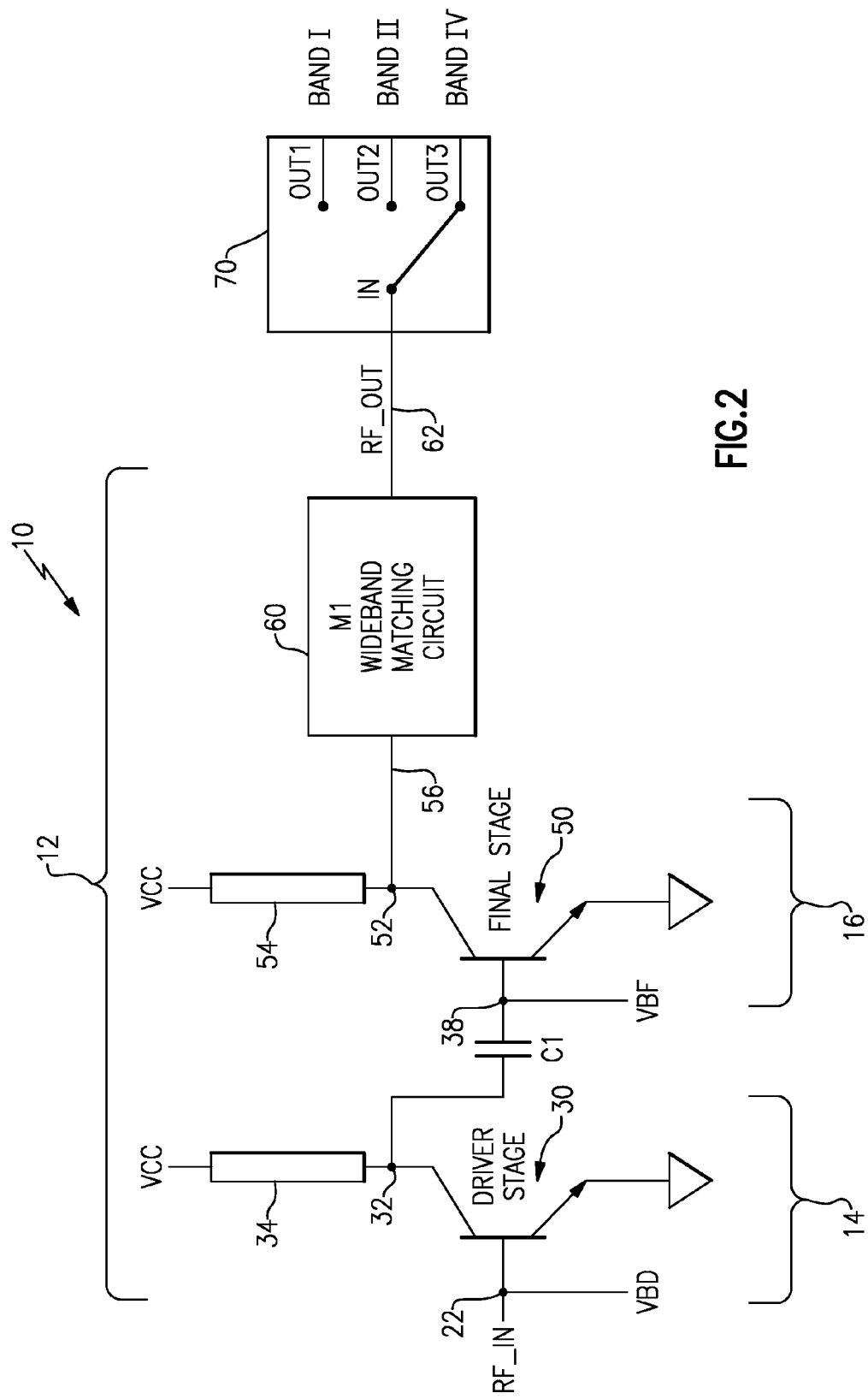
FIG. 2 shows an example of a conventional multi-mode multi-band (MMMB) PA system that includes a PA circuit configured to receive an input RF signal and generate an amplified RF signal.

FIG. 2 shows an example of a conventional multi-mode multi-band (MMMB) PA system 10 that includes a PA circuit 12 configured to receive an input RF signal (RF_IN) and generate an amplified RF signal (RF_OUT). The PA circuit 12 is shown to include a driver stage 14, a final stage 16, and an output matching circuit 60. Although described in the example context of such two stages, it will be understood that other numbers of stages can also be utilized.

The driver stage 14 is shown to include a bipolar junction transistor (BJT) 30 such as a heterojunction bipolar transistor (HBT). The input RF signal (RF_IN) is shown to be provided to a base of the driver stage BJT 30 at the base node 22. A partially amplified RF signal is shown to be output through the collector node 32 of the BJT 30 and provided to the final stage 16 through a capacitor C1. A base bias voltage VBD is shown to be provided to the base of the driver stage BJT 30 at the base node 22. A supply voltage VCC is shown to be provided to the collector of the driver stage BJT 30 through a circuit element 34 (e.g., a choke inductance) and the collector node 32.

The final stage 16 is shown to include a BJT 50 such as an HBT. The partially amplified RF signal from the driver stage 14 is shown to be provided to the base node 38 of the final stage BJT 50 from the collector node 32 of the driver stage BJT 30 through the capacitor C1. A further amplified RF signal 56 is shown to be output through a collector of the BJT 50. A base bias voltage VBF is shown to be provided to the base of the final stage BJT 50 at the base node 38. A supply voltage VCC is shown to be provided to the collector of the final stage BJT 50 through a circuit element 54 (e.g., a choke inductance) and the collector node 52.

In the example of FIG. 2, the PA 12 can further include a matching circuit 60; and such a matching circuit can be configured to provide a wideband matching functionality such that it provides desired impedance matching for all bands of interest (in this example, cellular Bands I, II, and IV). The amplified RF signal 56 from the final stage 16 is shown to be provided to a band selection switch 70 through the matching circuit 60. The example band selection switch 70 is shown to have a single-pole-triple-throw (SP3T) configuration with the switch input (IN) receiving the amplified RF signal from the matching circuit 60. The three example switch outputs (OUT1, OUT2, OUT3) are shown to be coupled to band paths associated with cellular 3G Bands I (1920-1980 MHz), II (1850-1910 MHz), and IV (1710-1755 MHz), respectively. It will be understood that other bands can also be utilized. It will also be understood that other numbers of bands can be implemented.

In the example of FIG. 2, operation of the switch 70 can allow a selected band to be connected to the switch input (IN), and therefore receive the amplified RF signal from the PA 12. More particularly, connecting the switch input (IN) to the first switch output (OUT1) allows the Band I path to receive the amplified RF signal; connecting the switch input (IN) to the second switch output (OUT2) allows the Band II path to receive the amplified RF signal; and connecting the switch input (IN) to the third switch output (OUT3) allows the Band IV path to receive the amplified RF signal.

Figure 3A:
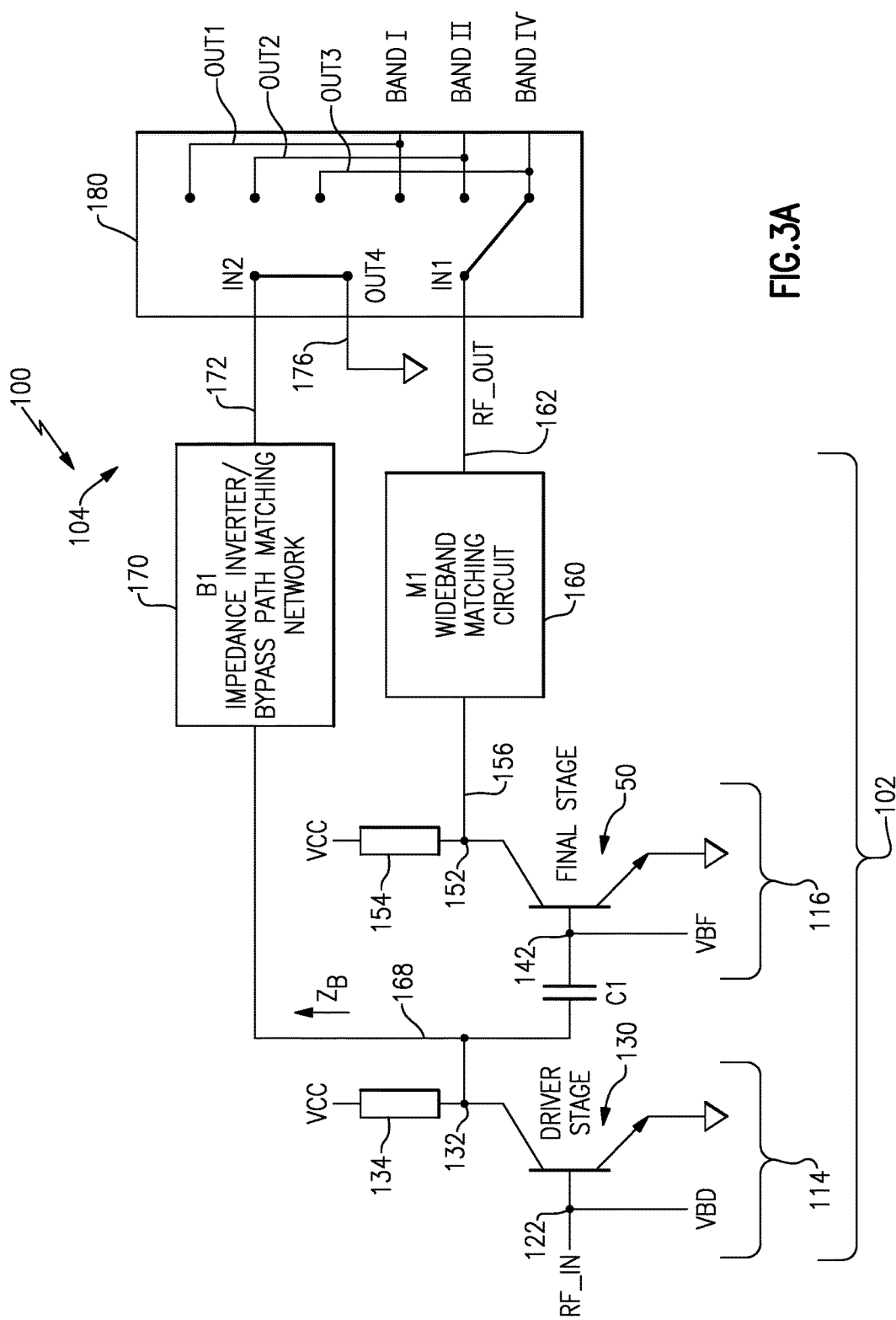
FIG. 3A shows a high power configuration of a first example PA system.
Figure 3B:
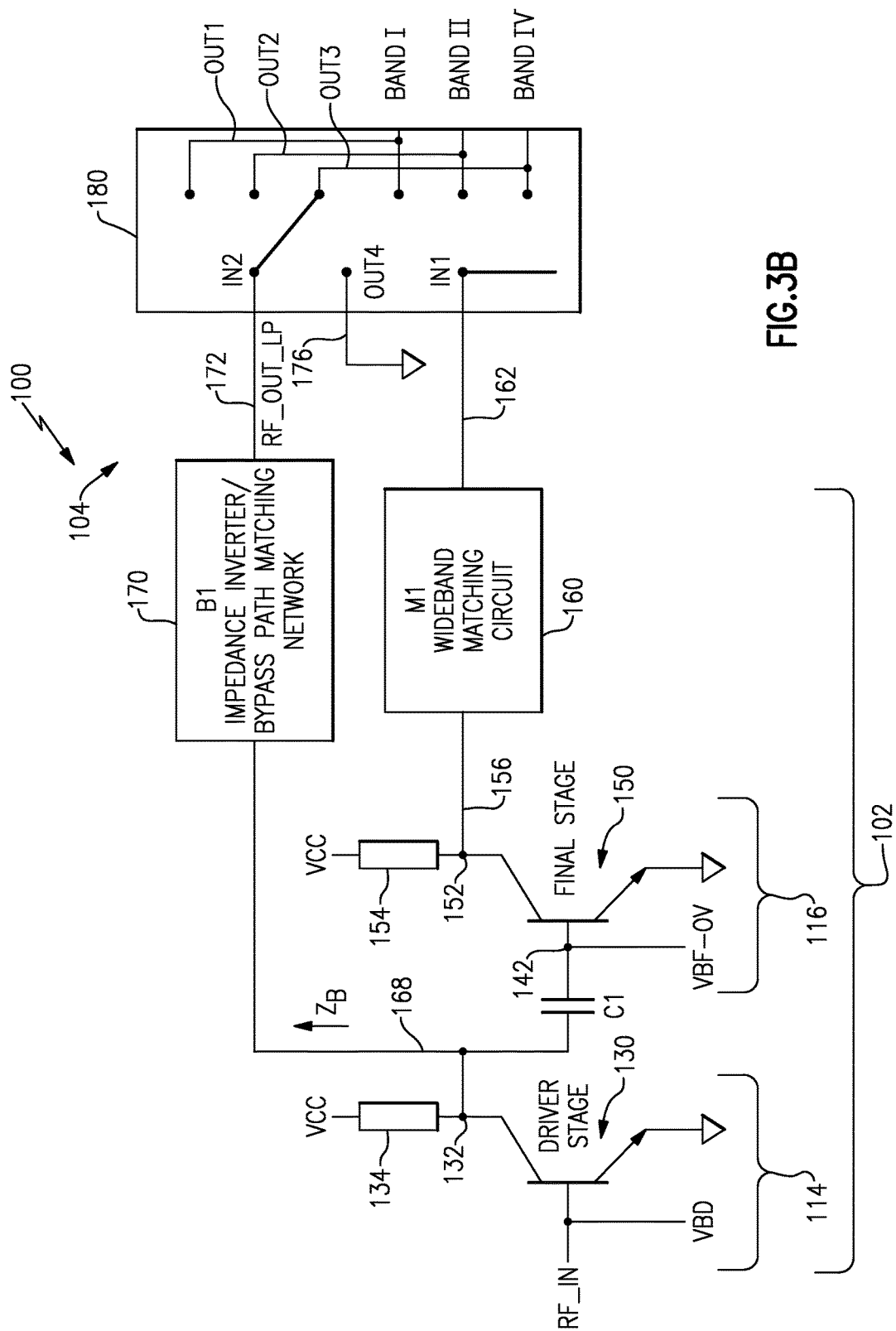
FIG. 3B shows a low power configuration of the first example PA system of FIG. 3A.
Figure 4A:
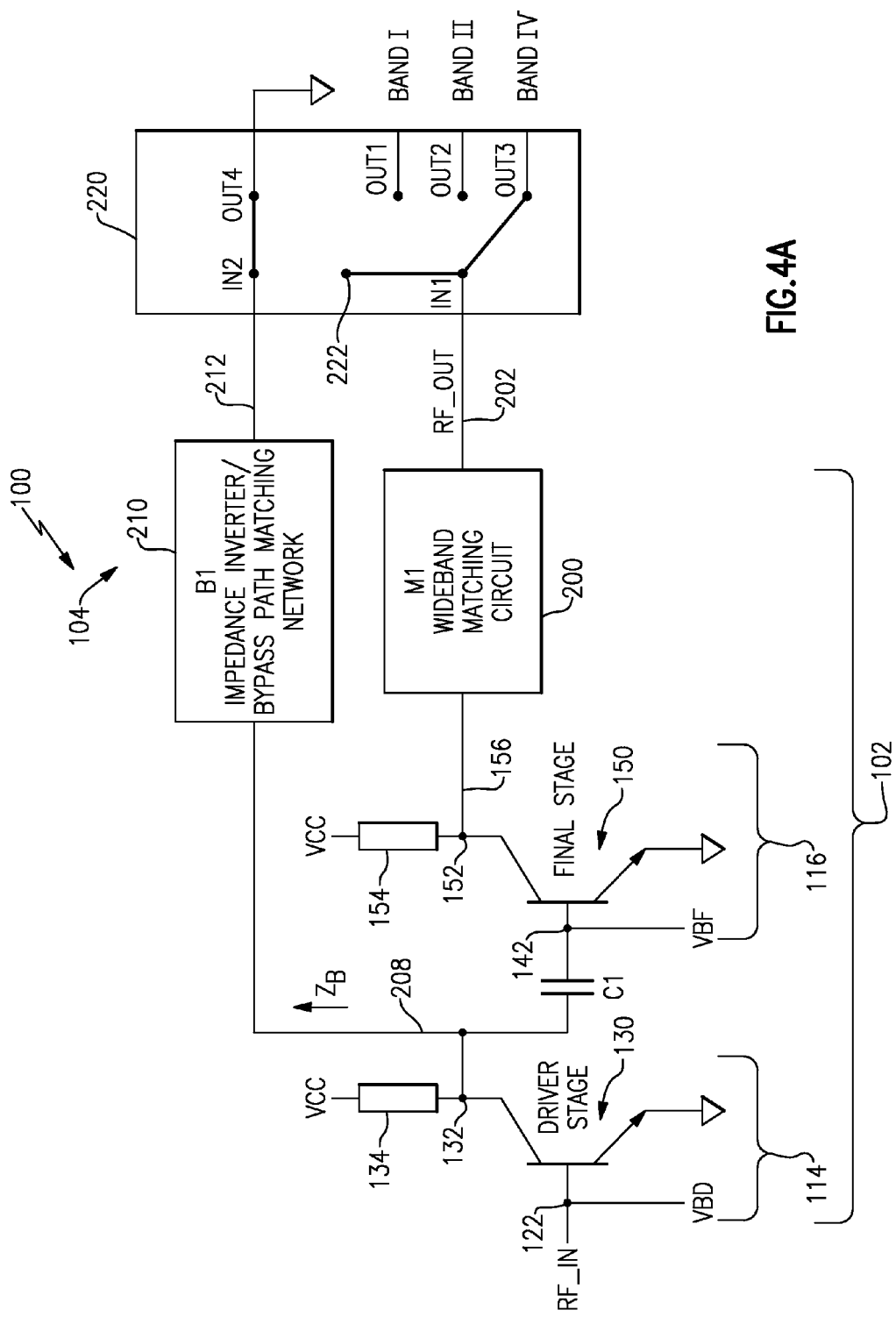
FIG. 4A shows a high power configuration of a second example PA system.
Figure 4B:
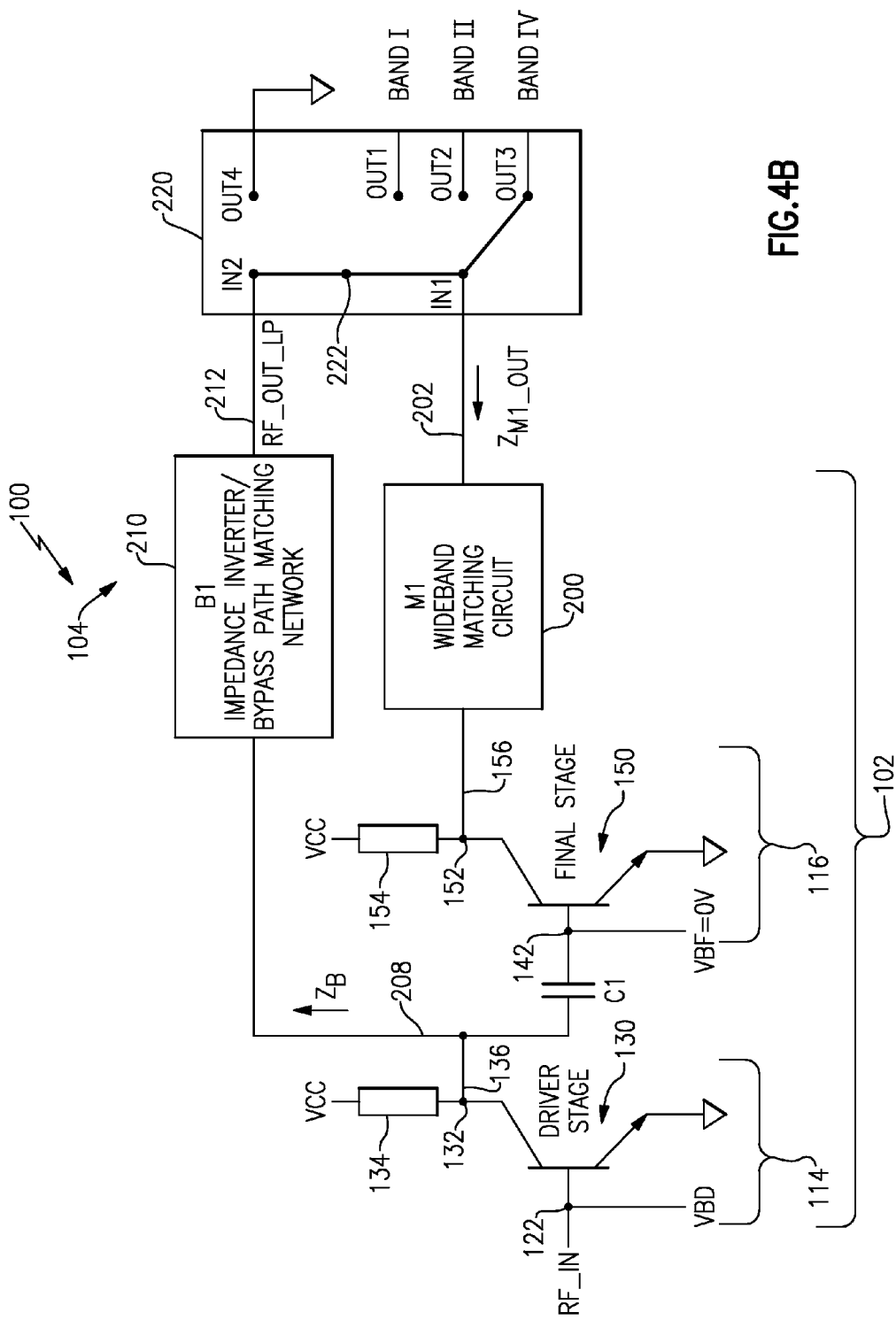
FIG. 4B shows a low power configuration of the second example PA system of FIG. 4A.
Figure 5A:
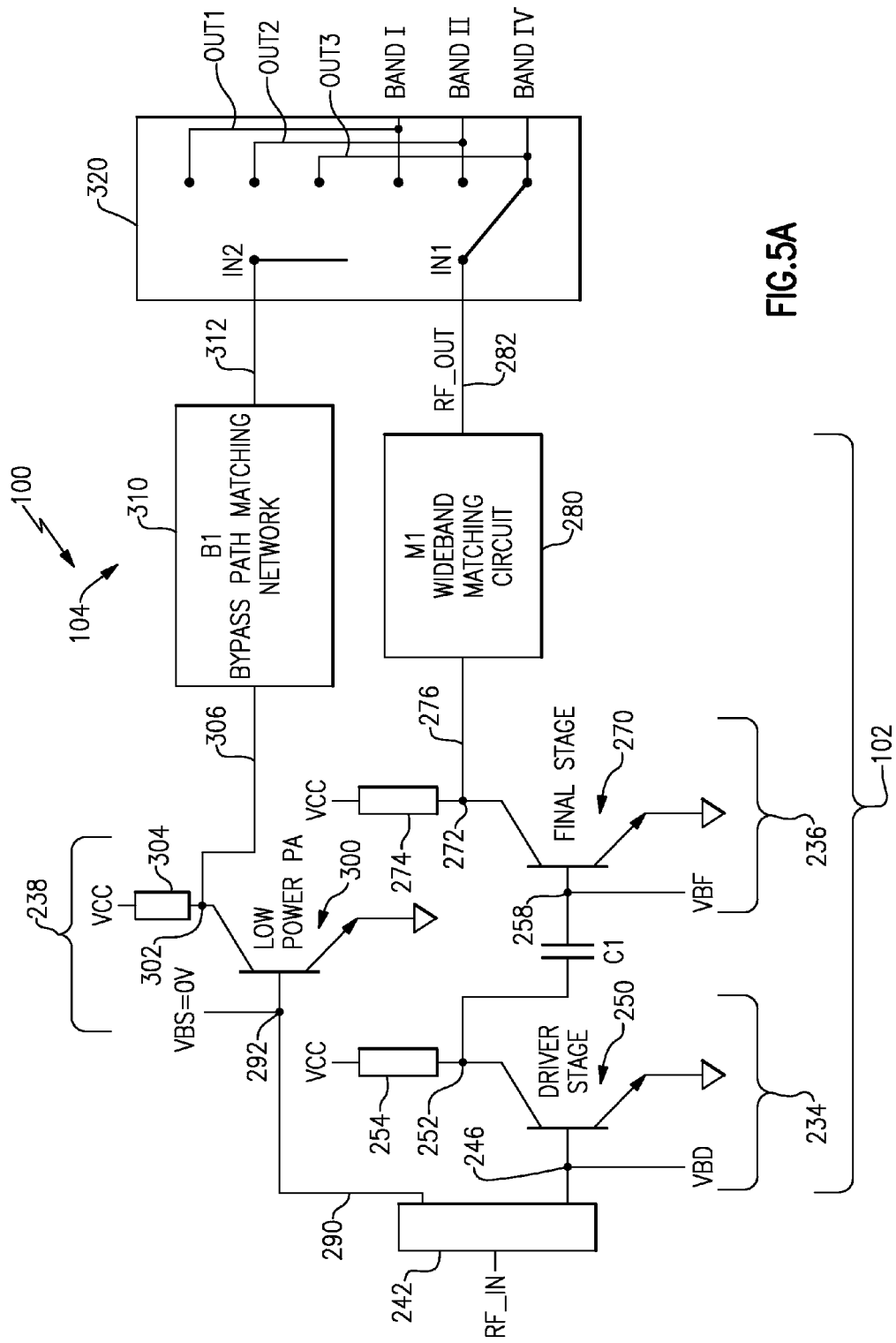
FIG. 5A shows a high power configuration of a third example PA system.
Figure 5B:
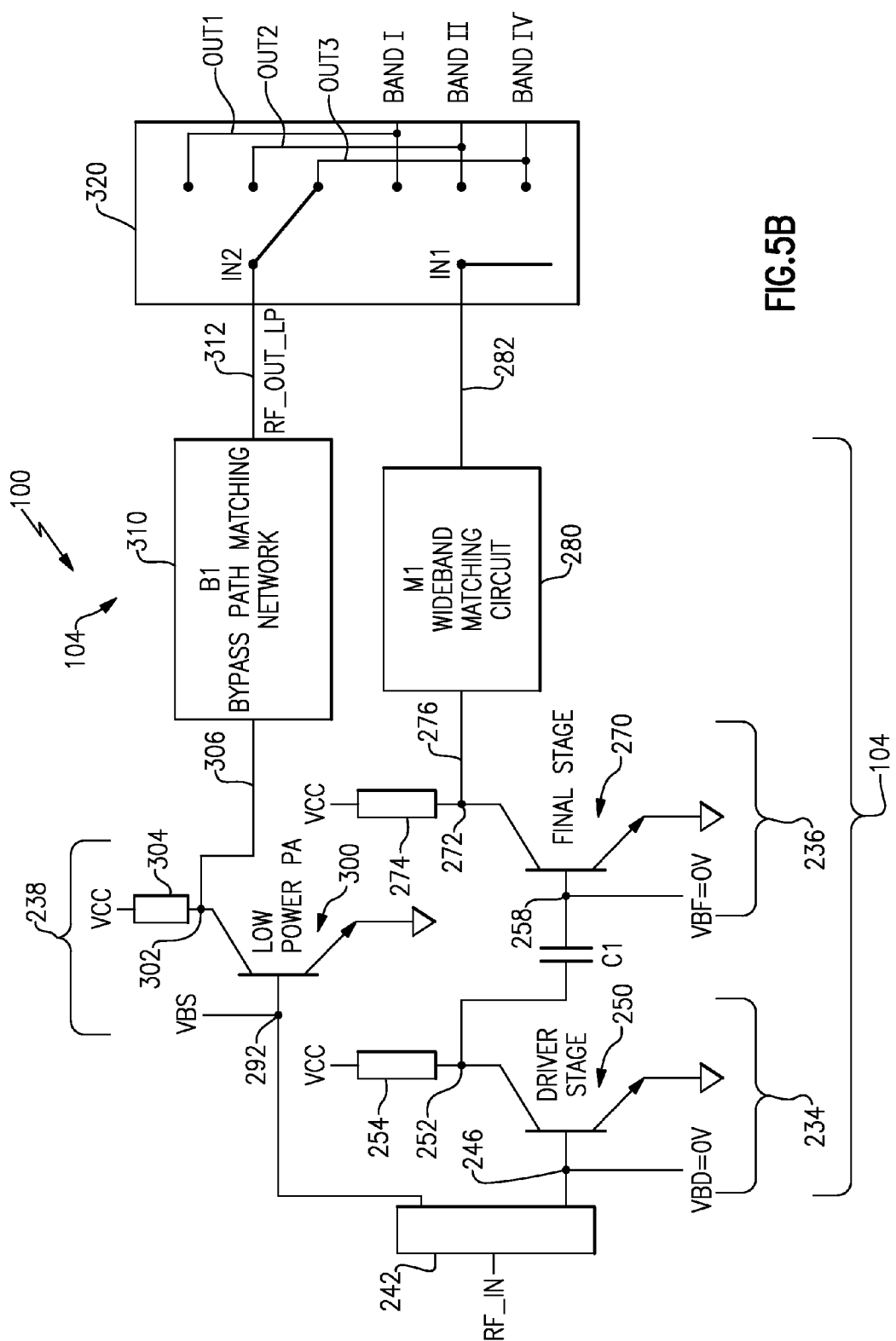
FIG. 5B shows a low power configuration of the third example PA system of FIG. 5A.

Examples of PA Systems with Bypass Circuits:

FIGS. 3-5 show examples of a PA system 100 having a bypass circuit 104 that allows the PA system 100 to operate in a low power mode in an efficient manner. FIGS. 3A and 3B shows a first example PA system 100. FIG. 3A shows a high power configuration of the first example PA system 100, and FIG. 3B shows a low power configuration of the same first example PA system 100. FIGS. 4A and 4B shows a second example PA system 100. FIG. 4A shows a high power configuration of the second example PA system 100, and FIG. 4B shows a low power configuration of the same second example PA system 100. FIGS. 5A and 5B shows a third example PA system 100. FIG. 5A shows a high power configuration of the third example PA system 100, and FIG. 5B shows a low power configuration of the same third example PA system 100.

EXAMPLE 1

In the first example shown in FIGS. 3A and 3B, a PA system 100 is shown to include a PA circuit 102 configured to operate with a bypass circuit 104. The PA circuit 102 can be configured to receive an input RF signal (RF_IN) and generate an amplified RF signal either as a high power output RF_OUT (FIG. 3A) or a low power output RF_OUT_LP (FIG. 3B). The PA circuit 102 is shown to include a driver stage 114, a final stage 116, a matching circuit 160 for high power operation, and a circuit 170 for low power operation. In the high power configuration of FIG. 3A, both of the driver stage 114 and the final stage 116 can be utilized; and in the low power configuration of FIG. 3B, the final stage 116 can be disabled and bypassed as described herein to yield the low power output. Although described in the example context of such two stages, it will be understood that other numbers of stages can also be utilized.

The driver stage 114 is shown to include a bipolar junction transistor (BJT) 130 such as a heterojunction bipolar transistor (HBT). The input RF signal (RF_IN) is shown to be provided at the base node 122 of the driver stage BJT 130. A partially amplified RF signal is shown to be output at the collector node 132 of the BJT 130. A base bias voltage VBD is shown to be provided to the base node 122 of the driver stage BJT 130. A supply voltage VCC is shown to be provided to the collector of the driver stage BJT 130 through a circuit element 134 (e.g., a choke inductance) and the collector node 132.

In the high power configuration (FIG. 3A), the partially amplified RF signal is shown to be provided to the base node 142 of the final stage BJT 150, from the collector node 132 of the driver stage 130 through a capacitor C1. A further amplified RF signal 156 is shown to be output through the collector node 152 of the final stage BJT 150. A base bias voltage VBF is shown to be provided to the base of the final stage BJT 150 at the base node 142. A supply voltage VCC is shown to be provided to the collector of the final stage BJT 150 through a circuit element 154 (e.g., a choke inductance) and the collector node 152.

In the high power configuration (FIG. 3A), the high power output 156 from the final stage 116 is shown to be provided to a matching circuit 160; and such a matching circuit can be configured to provide a wideband matching functionality such that it provides desired impedance matching for all bands of interest (in this example, cellular Bands I, II, and IV). The high power RF signal from the matching circuit 160 is shown to be provided to a switch circuit 180. Examples of how the switch circuit 180 can be configured and operated to facilitate the high power operation are described herein in greater detail.

In the low power configuration (FIG. 3B), the partially amplified RF signal can be provided from the driver stage collector node 132 to a bypass path matching network 170 so as to yield a low power RF signal as an output (RF_OUT_LP).

The circuit 170 can be configured to include an impedance inverter circuit and a matching circuit. The matching circuit can be configured to provide desired impedance matching for all bands of interest (in this example, cellular Bands I, II, and IV). In some embodiments, the circuit 170 can also be configured to provide a simple direct connection with without a matching circuit. The low power RF signal from the impedance inverter/matching circuit 170 is shown to be provided to the switch circuit 180. Examples of how the switch circuit 180 can be configured and operated to facilitate the low power operation are described herein in greater detail.

As shown in FIGS. 3A and 3B, the switch circuit 180 can include two inputs (IN1, IN2) and four outputs (OUT1, OUT2, OUT3, OUT4). The first switch input (IN1) is shown to be coupled to path 162 so as to receive the high power RF signal from the matching circuit 160 when the PA 102 is operated in the high power mode. The switching circuit 180 can be configured to connect the first switch input (IN1) to one of the three switch outputs (OUT1, OUT2, OUT3) when in the high power mode (FIG. 3A), and be opened when in the low power mode (FIG. 3B). The three example switch outputs (OUT1, OUT2, OUT3) are shown to be coupled to band paths associated with cellular 3G Bands I (1920-1980 MHz), II (1850-1910 MHz), and IV (1710-1755 MHz), respectively. It will be understood that other bands can also be utilized. It will also be understood that other numbers of bands can be implemented.

In the example high power configuration of FIG. 3A, operation of the switch 180 can allow a selected band to be connected to the first switch input (IN1), and therefore receive the high power RF signal from the matching circuit 160. More particularly, connecting the first switch input (IN1) to the first switch output (OUT1) allows the Band I path to receive the high power RF signal; connecting the first switch input (IN1) to the second switch output (OUT2) allows the Band II path to receive the high power RF signal; and connecting the first switch input (IN1) to the third switch output (OUT3) allows the Band IV path to receive the high power RF signal.

The second switch input (IN2) is shown to be coupled to path 172 so as to receive the low power RF signal RF_OUT_LP from the impedance inverter/matching circuit 170 when the PA 102 is operated in the low power mode. The switching circuit 180 can be configured to connect the second switch input (IN2) to one of the three switch outputs (OUT1, OUT2, OUT3) when in the low power mode (FIG. 3B), and be connected to the fourth switch output (OUT4) when in the high power mode (FIG. 3A). It is noted that the fourth switch output (OUT4) may be optional, or may be configured as a shunt terminating impedance (e.g., with or without a capacitor) that is coupled to path 172 when operating in the high power mode. For example, such a capacitor may be needed or desired if the switch is implemented in pseudomorphic high-electron-mobility transistor (PHEMT) process technology, and may not be needed or desired for a silicon-on-insulator (SOI) switch.

In the example low power configuration of FIG. 3B, operation of the switching circuit 180 can allow a selected band to be connected to the second switch input (IN2), and therefore receive the low power RF signal from the circuit 170. More particularly, connecting the second switch input (IN2) to the first switch output (OUT1) allows the Band I path to receive the low power RF signal; connecting the second switch input (IN2) to the second switch output (OUT2) allows the Band II path to receive the low power RF signal; and connecting the second switch input (IN2) to the third switch output (OUT3) allows the Band IV path to receive the low power RF signal.

As shown in FIGS. 3A and 3B, the bypass path 168 can have an impedance $Z_B$ seen by the partially amplified RF signal at the driver stage collector node 132. When the PA 102 is operating in a high power mode (FIG. 3A), the impedance $Z_B$ can be selected to be high to minimize or reduce undesired loading of the driver stage 130. In some embodiments, such a high impedance for $Z_B$ can be provided by the impedance inverter/matching circuit 170. When the PA 102 is operating in a low power mode (FIG. 3B), the impedance $Z_B$ can be selected to present a correct load impedance to promote amplification of the signal by the driver stage 130. In some embodiments, such a correct load impedance for $Z_B$ can be provided by the impedance inverter/matching circuit 170.

When the PA 102 is operating in a high power mode (FIG. 3A), the second switch input (IN2) of the switching circuit 180 can be connected to the fourth switch output (OUT4) which in turn can be connected to ground path 176. Such a grounding path can allow any residual RF signal to be shunted to ground. As described herein, the fourth switch output (OUT4) may be optional, or may be configured as a shunt terminating impedance that is coupled to path 172 when operating in the high power mode.

As further shown in FIG. 3A, the base bias voltage for each of the driver stage transistor 130 and the final stage transistor 150 can be at an operating value when the PA 102 is operating in the high power mode. For example, VBD for the driver stage transistor 130 can be a non-zero operating value. Similarly, VBF for the final stage transistor 150 can be a non-zero operating value.

When the PA 102 is operating in a low power mode (FIG. 3B), the first switch input (IN1) of the switching circuit 180 can be disconnected from any other terminal. Further, the final stage transistor 150 can be turned off by, for example, setting VBF to an off value. For example, VBF for the final stage transistor 150 can be set to approximately zero V. In some embodiments, the final stage transistor 150 being turned off can reduce undesired loading of the driver stage when operating in the low power mode.

EXAMPLE 2

In the second example shown in FIGS. 4A and 4B, a PA system 100 is shown to include a PA circuit 102 configured to operate with a bypass circuit 104. The PA circuit 102 can be configured to receive an input RF signal (RF_IN) and generate an amplified RF signal either as a high power output RF_OUT (FIG. 4A) or a low power output RF_OUT_LP (FIG. 4B). The PA circuit 102 is shown to include a driver stage 114, a final stage 116, a matching circuit 200 for high power operation, and a circuit 210 for low power operation. In the high power configuration of FIG. 4A, both of the driver stage 114 and the final stage 116 can be utilized; and in the low power configuration of FIG. 4B, the final stage 116 can be disabled and bypassed as described herein to yield the low power output. Although described in the example context of such two stages, it will be understood that other numbers of stages can also be utilized.

The driver stage 114 is shown to include a bipolar junction transistor (BJT) 130 such as a heterojunction bipolar transistor (HBT). The input RF signal (RF_IN) is shown to be provided at the base node 122 of the driver stage BJT 130. A partially amplified RF signal is shown to be output at the collector node 132 of the BJT 130. A base bias voltage VBD is shown to be provided to the base node 122 of the driver stage BJT 130. A supply voltage VCC is shown to be provided to the collector of the driver stage BJT 130 through a circuit element 134 (e.g., a choke inductance) and the collector node 132.

In the high power configuration (FIG. 4A), the partially amplified RF signal is shown to be provided to the base node 142 of the final stage BJT 150, from the collector node 132 of the driver stage 130 through a capacitor C1. A further amplified RF signal 156 is shown to be output through the collector node 152 of the final stage BJT 150. A base bias voltage VBF is shown to be provided to the base of the final stage BJT 150 at the base node 142. A supply voltage VCC is shown to be provided to the collector of the final stage BJT 150 through a circuit element 154 (e.g., a choke inductance) and the collector node 152.

In the high power configuration (FIG. 4A), the high power output 156 from the final stage 116 is shown to be provided to a matching circuit 200; and such a matching circuit can be configured to provide a wideband matching functionality such that it provides desired impedance matching for all bands of interest (in this example, cellular Bands I, II, and IV). The high power RF signal from the matching circuit 200 is shown to be provided to a switch circuit 220. Examples of how the switch circuit 220 can be configured and operated to facilitate the high power operation are described herein in greater detail.

In the low power configuration (FIG. 4B), the partially amplified RF signal can be provided from the driver stage collector node 132 to a bypass path matching network 210 so as to yield a low power RF signal as an output (RF_OUT_LP).

The circuit 210 can be configured to include an impedance inverter circuit and a matching circuit. The matching circuit can be configured to provide desired impedance matching for all bands of interest (in this example, cellular Bands I, II, and IV). In some embodiments, the circuit 210 can also be configured to provide a simple direct connection with without a matching circuit. The low power RF signal from the impedance inverter/matching circuit 210 is shown to be provided to the switch circuit 220. Examples of how the switch circuit 220 can be configured and operated to facilitate the low power operation are described herein in greater detail.

As shown in FIGS. 4A and 4B, the switch circuit 220 can include two inputs (IN1, IN2) and four outputs (OUT1, OUT2, OUT3, OUT4). The first switch input (IN1) is shown to be coupled to path 202 so as to receive the high power RF signal from the matching circuit 200 when the PA 102 is operated in the high power mode. The switching circuit 220 can be configured to connect the first switch input (IN1) to one of the switch outputs (OUT1, OUT2, OUT3) when in the high power mode (FIG. 4A), and connect the second switch input (IN2) to one of the switch outputs (OUT1, OUT2, OUT3) through a node 222 and the first switch input (IN1) when in the low power mode (FIG. 4B). The three example switch outputs (OUT1, OUT2, OUT3) are shown to be coupled to band paths associated with cellular 3G Bands I (1920-1980 MHz), II (1850-1910 MHz), and IV (1710-1755 MHz), respectively. It will be understood that other bands can also be utilized. It will also be understood that other numbers of bands can be implemented.

In the example high power configuration of FIG. 4A, operation of the switch 220 can allow a selected band to be connected to the first switch input (IN1), and therefore receive the high power RF signal from the matching circuit 200. More particularly, connecting the first switch input (IN1) to the first switch output (OUT1) allows the Band I path to receive the high power RF signal; connecting the first switch input (IN1) to the second switch output (OUT2) allows the Band II path to receive the high power RF signal; and connecting the first switch input (IN1) to the third switch output (OUT3) allows the Band IV path to receive the high power RF signal.

The second switch input (IN2) is shown to be coupled to path 212 so as to receive the low power RF signal RF_OUT_LP from the impedance inverter/matching circuit 210 when the PA 102 is operated in the low power mode. The switching circuit 220 can be configured to connect the second switch input (IN2) to the fourth switch output (OUT4) when in the high power mode (FIG. 4A), and be connected to the first switch input (IN1) through the node 222 when in the low power mode (FIG. 4B).

When in the low power mode (FIG. 4B), the foregoing connection between the second switch input (IN2) and the first switch input (IN1), along with a connection between the first switch input (IN1) and one of the three example switch outputs (OUT1, OUT2, OUT3) can allow the second switch input (IN2) to be connected to the corresponding one of the example band paths (e.g., cellular 3G Bands I (1920-1980 MHz), II (1850-1910 MHz), and IV (1710-1755 MHz), respectively). It will be understood that other bands can also be utilized. It will also be understood that other numbers of bands can be implemented.

In the example low power configuration of FIG. 4B, operation of the switching circuit 220 can allow a selected band to be connected to the second switch input (IN2) through the node 222 and the first switch input (IN1), and therefore receive the low power RF signal from path 212. More particularly, connecting the first switch input (IN1) to the first switch output (OUT1) allows the Band I path to receive the low power RF signal; connecting the first switch input (IN1) to the second switch output (OUT2) allows the Band II path to receive the low power RF signal; and connecting the first switch input (IN1) to the third switch output (OUT3) allows the Band IV path to receive the low power RF signal.

As shown in FIGS. 4A and 4B, the bypass path 208 can have an impedance $Z_B$ seen by the partially amplified RF signal at the driver stage collector node 132. When the PA 102 is operating in a high power mode (FIG. 4A), the impedance $Z_B$ can be selected to be high to minimize or reduce undesired loading of the driver stage 130. In some embodiments, such a high impedance for $Z_B$ can be provided by the impedance inverter/matching circuit 210. When the PA 102 is operating in a low power mode (FIG. 4B), the impedance $Z_B$ can be selected to present a correct load impedance to promote amplification of the signal by the driver stage 130. In some embodiments, such a correct load impedance for $Z_B$ can be provided by the impedance inverter/matching circuit 210.

When the PA 102 is operating in a high power mode (FIG. 4A), the second switch input (IN1) of the switching circuit 220 can be connected to the fourth switch output (OUT4) which in turn can be connected to ground. Such a grounding path can allow any residual RF signal to be shunted to ground. In some embodiments, the fourth switch output (OUT4) may be optional, or may be configured as a shunt terminating impedance that is coupled to path 212 when operating in the high power mode. Such a shunt terminating impedance may or may not include a capacitor. For example, such a capacitor may be needed or desired if the switch is implemented in PHEMT, and may not be needed or desired for an SOI switch.

As further shown in FIG. 4A, the base bias voltage for each of the driver stage transistor 130 and the final stage transistor 150 can be at an operating value when the PA 102 is operating in the high power mode. For example, VBD for the driver stage transistor 130 can be a non-zero operating value. Similarly, VBF for the final stage transistor 150 can be a non-zero operating value.

When the PA 102 is operating in a low power mode (FIG. 4B), the second switch input (IN2) can be connected to one of the three switch outputs (OUT1, OUT2, OUT3) through the node 222 and the first switch input (IN1). Further, the final stage transistor 150 can be turned off by, for example, setting VBF to an off value. For example, VBF for the final stage transistor 150 can be set to approximately zero V.

In some embodiments, the matching circuit 200 can be configured such that when the final stage transistor 150 is disabled in the low power mode (FIG. 4B), it provides a sufficiently high impedance for an impedance $Z_{M1\_OUT}$ seen by the low power RF signal at the first switch input (IN1). In some embodiments, the final stage transistor 150 being turned off (to reduce undesired loading of the driver stage when operating in low power mode) and the matching circuit 200 providing the high impedance for $Z_{M1\_OUT}$ can inhibit the low power RF signal from entering the final stage 116 from the bypass node 138, as well as inhibit the low power RF signal from entering the path 202 from the first switch input (IN1).

EXAMPLE 3

In the examples described herein in reference to FIGS. 3 and 4, the low power configuration involves a bypass path that begins after a driver stage. FIGS. 5A and 5B shows that in some embodiments, a separate amplification path can provide a low power amplification path. In the third example shown in FIGS. 5A and 5B, a PA system 100 is shown to include a PA circuit 102 configured to operate with a bypass circuit 104. The PA circuit 102 can be configured to receive an input RF signal (RF_IN) and generate an amplified RF signal either as a high power output RF_OUT (FIG. 5A) or a low power output RF_OUT_LP (FIG. 5B). The PA circuit 102 is shown to include substantially separate amplification paths, including a high power amplification path and a low power amplification path. The high amplification path is shown to include a driver stage 234, a final stage 236, and a matching circuit 280. The low amplification path is shown to include a low power amplification stage 238 and a matching network 310. The input RF signal (RF_IN) is shown to be received through a common input, and such an RF signal can be routed to either the high path amplification path or the low power amplification path by a routing circuit 242. Such routing of the input RF signal can be achieved by, for example, a switch.

In the example PA 102 of FIGS. 5A and 5B, the high power amplification path is shown to include the routing circuit 242 coupled to a driver stage 234 which is in turn coupled to a final stage 236. In the high power configuration of FIG. 5A, both of the driver stage 234 and the final stage 236 can be utilized; and in the low power configuration of FIG. 5B, both of the driver stage 234 and the final stage 236 can be disabled and bypassed as described herein to yield a low power output from the PA system 100. Although described in the example context of such two stages, it will be understood that other numbers of stages can also be utilized.

The driver stage 234 is shown to include a bipolar junction transistor (BJT) 250 such as a heterojunction bipolar transistor (HBT). The input RF signal (RF_IN) is shown to be provided at the base node 246 of the driver stage BJT 250. A partially amplified RF signal is shown to be output at the collector node 252 of the BJT 250. A base bias voltage VBD is shown to be provided to the base node 246 of the driver stage BJT 250. A supply voltage VCC is shown to be provided to the collector of the driver stage BJT 250 through a circuit element 254 (e.g., a choke inductance) and the collector node 252.

The partially amplified RF signal is shown to be provided to the base node 258 of the final stage BJT 270, from the collector node 252 of the driver stage 250 through a capacitor C1. A further amplified RF signal 276 is shown to be output through the collector node 272 of the BJT 270. A base bias voltage VBF is shown to be provided to the base of the final stage BJT 270 at the base node 258. A supply voltage VCC is shown to be provided to the collector of the final stage BJT 270 through a circuit element 274 (e.g., a choke inductance) and the collector node 272.

In the high power configuration (FIG. 5A), the high power output 276 from the final stage 236 is shown to be provided to a matching circuit 280; and such a matching circuit can be configured to provide a wideband matching functionality such that it provides desired impedance matching for all bands of interest (in this example, cellular Bands I, II, and IV). The high power RF signal from the matching circuit 280 is shown to be provided to a switch circuit 320. Examples of how the switch circuit 320 can be configured and operated to facilitate the high power operation are described herein in greater detail.

In the low power configuration of FIG. 5B, the low power amplification stage 238 can be utilized, bypassing the high power amplification path as described herein, to yield the low power output. Although the low power amplification path is described in the example context of one amplification stage, it will be understood that other numbers of stages can also be utilized.

The amplification stage 238 is shown to include a bipolar junction transistor (BJT) 300 such as a heterojunction bipolar transistor (HBT). The input RF signal (RF_IN) is shown to be provided at the base node 292 of the amplification stage BJT 300. An amplified RF signal is shown to be output at the collector node 302 of the BJT 300. A base bias voltage VBS is shown to be provided to the base node 292 of the amplification stage BJT 300. A supply voltage VCC is shown to be provided to the collector of the driver stage BJT 300 through a circuit element 304 (e.g., a choke inductance) and the collector node 302.

In the low power configuration (FIG. 5B), the output from the amplification stage 238 can be the low power RF signal (RF_OUT_LP). Such an output signal is shown to be provided to a matching circuit 310. The low power RF signal from the matching circuit 310 is shown to be provided to the switch circuit 320. Examples of how the switch circuit 320 can be configured and operated to facilitate the low power operation are described herein in greater detail.

As shown in FIGS. 5A and 5B, the switch circuit 320 can include two inputs (IN1, IN2) and three outputs (OUT1, OUT2, OUT3). The first switch input (IN1) is shown to be coupled to path 282 so as to receive the high power RF signal from the matching circuit 280 when the PA 102 is operated in the high power mode. The switching circuit 320 can be configured to connect the first switch input (IN1) to one of the three switch outputs (OUT1, OUT2, OUT3) when in the high power mode (FIG. 5A), and be opened when in the low power mode (FIG. 5B). The three example switch outputs (OUT1, OUT2, OUT3) are shown to be coupled to band paths associated with cellular 3G Bands I (1920-1980 MHz), II (1850-1910 MHz), and IV (1710-1755 MHz), respectively. It will be understood that other bands can also be utilized. It will also be understood that other numbers of bands can be implemented.

In the example high power configuration of FIG. 5A, operation of the switch 320 can allow a selected band to be connected to the first switch input (IN1), and therefore receive the high power RF signal from the matching circuit 280. More particularly, connecting the first switch input (IN1) to the first switch output (OUT1) allows the Band I path to receive the high power RF signal; connecting the first switch input (IN1) to the second switch output (OUT2) allows the Band II path to receive the high power RF signal; and connecting the first switch input (IN1) to the third switch output (OUT3) allows the Band IV path to receive the high power RF signal.

The second switch input (IN2) is shown to be coupled to path 312 so as to receive the low power RF signal RF_OUT_LP from the matching circuit 310 when the PA 102 is operated in the low power mode. The switching circuit 320 can be configured to connect the second switch input (IN2) to one of the three switch outputs (OUT1, OUT2, OUT3) when in the low power mode (FIG. 5B), and be opened when in the high power mode (FIG. 5A). As described herein, the three example switch outputs (OUT1, OUT2, OUT3) are connected to the example band paths associated with cellular 3G Bands I (1920-1980 MHz), II (1850-1910 MHz), and IV (1710-1755 MHz), respectively.

In the example low power configuration of FIG. 5B, operation of the switch 320 can allow a selected band to be connected to the second switch input (IN2), and therefore receive the low power RF signal RF_OUT_LP from the matching circuit 310. More particularly, connecting the second switch input (IN2) to the first switch output (OUT1) allows the Band I path to receive the low power RF signal; connecting the second switch input (IN2) to the second switch output (OUT2) allows the Band II path to receive the low power RF signal; and connecting the second switch input (IN2) to the third switch output (OUT3) allows the Band IV path to receive the low power RF signal.

As shown in the high power mode of FIG. 5A, the base bias voltage for each of the driver stage transistor 250 and the final stage transistor 270 can be at an operating value. For example, VBD for the driver stage transistor 250 can be a non-zero operating value. Similarly, VBF for the final stage transistor 270 can be a non-zero operating value.

In the high power mode of FIG. 5A, the amplification stage transistor 300 can be turned off by, for example, setting the base bias voltage VBS to an off value. For example, VBS for the amplification stage transistor 300 can be set to approximately zero V. In some embodiments, some or all of the routing performed at the routing circuit 242, the amplification stage transistor 300 being turned off, and the second switch input (IN2) of the switching circuit 320 being opened, can inhibit passage of the input RF signal through the low power amplification path when the PA 102 is in the high power mode.

As shown in the low power mode of FIG. 5B, the base bias voltage for the amplification stage transistor 300 can be at an operating value. For example, VBS for the amplification stage transistor 300 can be a non-zero operating value.

In the low power mode of FIG. 5B, each of the driver stage transistor 250 and the final stage transistor 270 can be turned off by, for example, setting the base bias voltage to an off value. For example, VBD for the driver stage transistor 250 can be set to approximately zero V. Similarly, VBF for the final stage transistor 270 can be set to approximately zero V. In some embodiments, some or all of the routing performed at the routing circuit 242, the driver stage transistor 250 being turned off, the final stage transistor 270 being turned off, and the first switch input (IN1) of the switching circuit 320 being opened, can inhibit passage of the input RF signal through the high power amplification path when the PA 102 is in the low power mode.

Figure 6A:
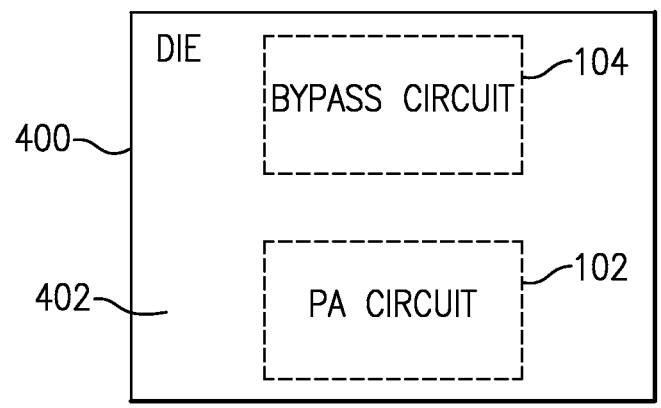
FIGS. 6A and 6B show that a PA system having one or more features as described herein can be implemented on one or more die.
Figure 6B:
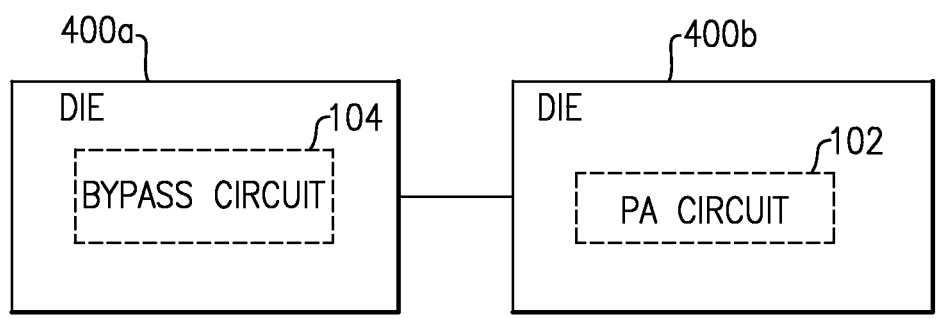
Figure 7:
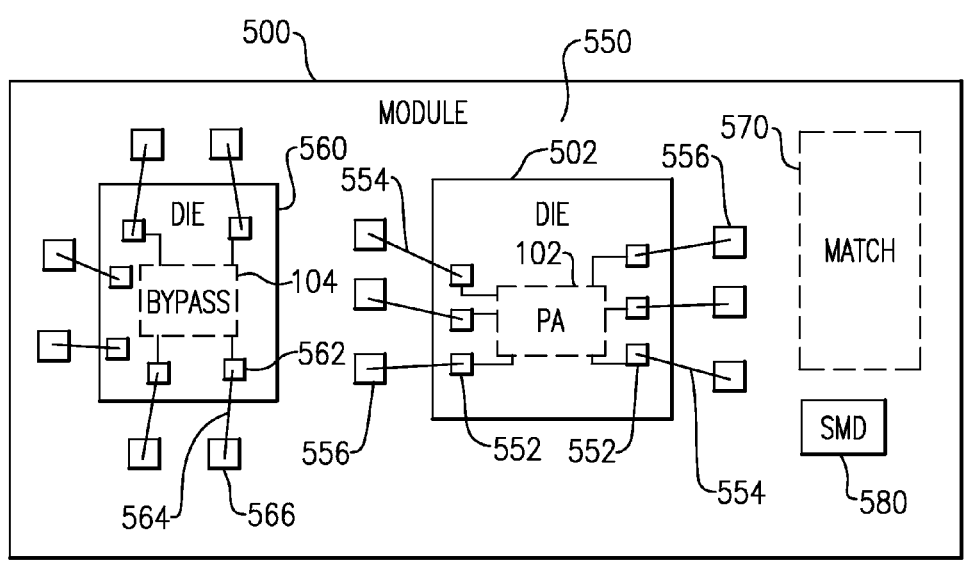
FIG. 7 depicts an example module that includes a PA system having one or more features as described herein.
Figure 8:
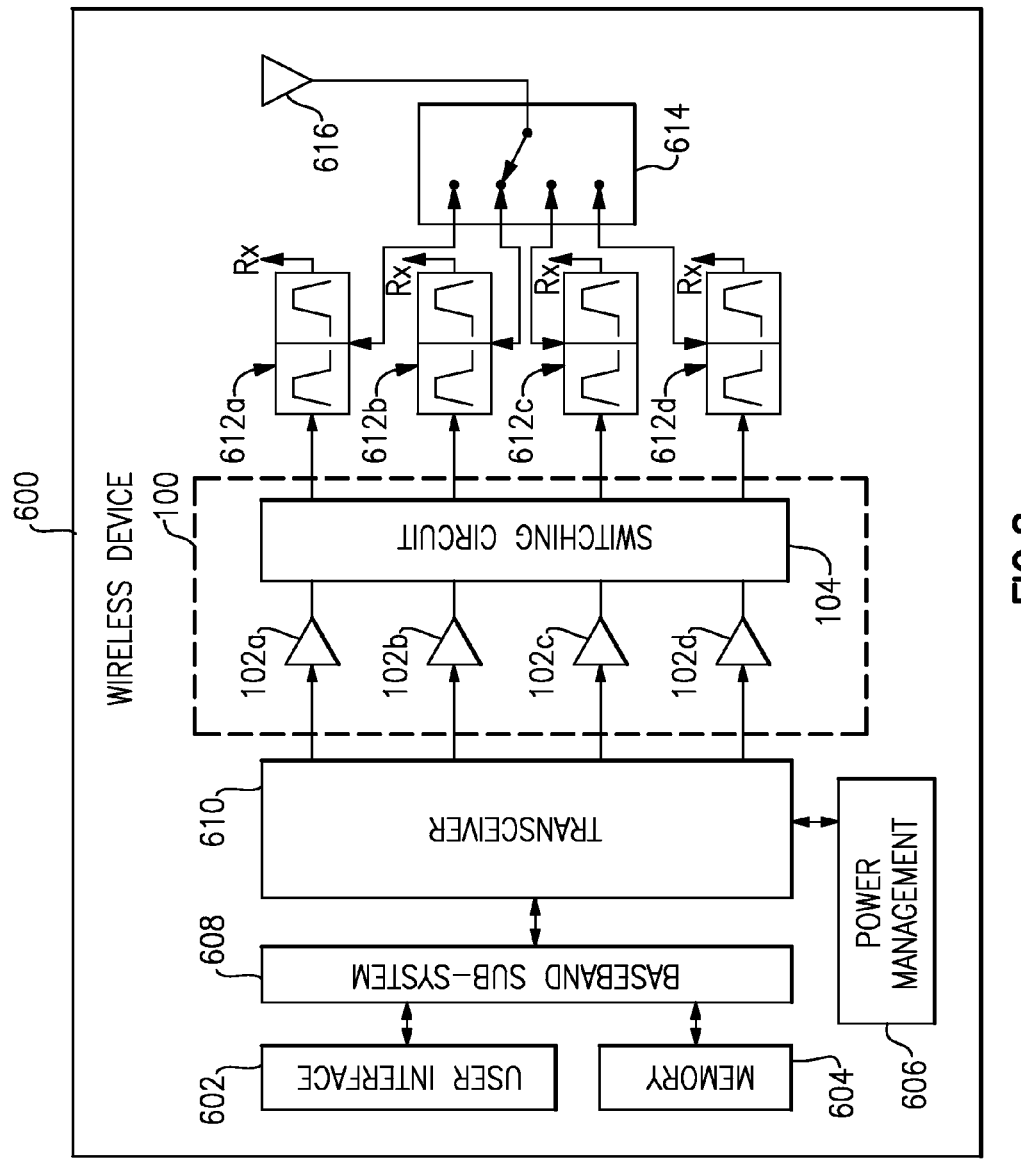
FIG. 8 depicts an example wireless device having one or more advantageous features described herein.

Example Implementations:

In some embodiments, a PA system having one or more features as described herein can be implemented in different products. FIGS. 6-8 show non-limiting examples of such products. FIGS. 6A and 6B show examples of implementations at a die level. FIG. 7 shows an example of an implementation at a module level. FIG. 8 shows an example of an implementation at a wireless device level.

FIGS. 6A and 6B show that a PA system having one or more features as described herein can be implemented on one or more die. FIG. 6A shows that in some embodiments, some or all of a bypass circuit 104 can be formed on a semiconductor substrate 402 of a die 400 that also includes a PA circuit 102. Such a die can include, for example, an HBT die based on gallium arsenide (GaAs) substrate.

FIG. 6B shows that in some embodiments, some or all of a bypass circuit 104 can be implemented on a first semiconductor die 400a, and some or all of a PA circuit 102 can be implemented on a second semiconductor die 400b. The first and second die 400a, 400b may or may not be based on the same semiconductor substrate.

FIG. 7 schematically depicts an example module 500 that includes a PA system having one or more features as described herein. The example module 500 is shown to include a PA die 502 that includes a PA circuit 102. In the example of FIG. 7, a bypass circuit 104 is depicted as being implemented on a separate die 560. However, it will be understood that the PA circuit 102 and the bypass circuit 104 can be configured in other manners, including in a configuration where some or all of both of the circuits are implemented on a common die.

In the example module 500 of FIG. 7, the die 502 is shown to be mounted on a substrate 550. Such a die can be fabricated using a number of semiconductor process technologies, including the examples described herein. The die 502 can include a plurality of electrical contact pads 552 configured to allow formation of electrical connections 554 such as wirebonds between the die 502 and contact pads 556 formed on the packaging substrate 550.

In FIG. 7, the die 560 as described herein is shown to be mounted on the substrate 550. Such a die can be fabricated using a number of semiconductor process technologies, including the examples described herein. The die 560 can include a plurality of electrical contact pads 562 configured to allow formation of electrical connections 564 such as wirebonds between the die 560 and contact pads 566 formed on the packaging substrate 550.

The packaging substrate 550 can be configured to receive a plurality of components such as the die 502, 560 and one or more SMDs (e.g., 580). In some embodiments, the packaging substrate 550 can include a laminate substrate.

In the example packaged module 500, a matching circuit 570 can be implemented on or within the substrate 550. Such a matching circuit 570 can provide matching functionality for matching networks associated with the PA circuit 102.

In some embodiments, the module 500 can also include one or more packaging structures to, for example, provide protection and facilitate easier handling of the module 500. Such a packaging structure can include an overmold formed over the packaging substrate 550 and dimensioned to substantially encapsulate the various circuits and components thereon.

It will be understood that although the module 500 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

FIG. 8 depicts an example wireless device 600 having one or more advantageous features described herein. In the example, one or more PAs 102 are shown to be coupled to a switching circuit 104 having one or more features as described herein. Such PAs and switching circuit can facilitate, for example, multi-band operation of the wireless device 600. In some embodiments, a PA system 100 depicted by a dashed box can include the PAs 102 and the switching circuit 104.

The PAs 102 can receive their respective RF signals from a transceiver 610 that can be configured and operated to generate RF signals to be amplified and transmitted, and to process received signals. The transceiver 610 is shown to interact with a baseband sub-system 608 that is configured to provide conversion between data and/or voice signals suitable for a user and RF signals suitable for the transceiver 610. The transceiver 610 is also shown to be connected to a power management component 606 that is configured to manage power for the operation of the wireless device 600. Such power management can also control operations of some or all of the baseband sub-system 608, the PA system 100, and the switching circuit 104.

The baseband sub-system 608 is shown to be connected to a user interface 602 to facilitate various input and output of voice and/or data provided to and received from the user. The baseband sub-system 608 can also be connected to a memory 604 that is configured to store data and/or instructions to facilitate the operation of the wireless device 600, and/or to provide storage of information for the user.

In the example wireless device 600, outputs of the PAs 102 are shown to be switched by the switching circuit 104 as described herein and be routed to an antenna 616 via their respective duplexers 612a-612d and an antenna switch 614. The antenna switch 614 can be configured to allow selection of, for example, an operating band and/or transmit/receive functionality. In some embodiments, each duplexer 612 can allow transmit and receive operations to be performed simultaneously using a common antenna (e.g., 616). In FIG. 8, received signals are shown to be routed to "Rx" paths (not shown) that can include, for example, one or more low-noise amplifiers (LNAs).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power-amplifier (PA) system comprising:
a first amplification path having one or more PAs configured to generate a high power radio-frequency (RF) signal from an input RF signal when in a high power mode;
a second amplification path having one or more PAs configured to generate a low power RF signal from the input RF signal when in a low power mode;
a routing circuit configured to receive and route the input RF signal to the first amplification path or the second amplification path; and
a switching circuit including a first pole coupled to the first amplification path and a second pole coupled to the second amplification path, the switching circuit configured to route the high power RF signal through the first pole or the low power RF signal through the second pole to a selected output path among a plurality of output paths corresponding to a plurality of operating bands.

2. The PA system of claim 1 wherein the switching circuit further includes a plurality of output throws in communication with the plurality of output paths, the switching circuit configured to connect the first pole to the selected output path when in the high power mode, and to connect the second pole to the selected output path when in the low power mode.

3. The PA system of claim 2 further comprising a matching circuit implemented along each of the first amplification path and the second amplification path, the matching circuit being between the one or more PAs and the switching circuit.

4. The PA system of claim 3 wherein the first amplification path includes a driver stage and a final stage arranged in series, the driver stage configured to partially amplify the input RF signal, the final stage configured to further amplify the partially amplified RF signal to generate the high power RF signal.

5. The PA system of claim 4 wherein the matching circuit along the first amplification path is implemented between the final stage and the switching circuit.

6. The PA system of claim 5 wherein the matching circuit is configured to provide a wideband matching functionality.

7. The PA system of claim 4 wherein the second amplification path includes an amplification stage configured to amplify the input RF signal to generate the low power RF signal.

8. The PA system of claim 2 wherein the switching circuit is configured to connect the first pole to the selected output path through a corresponding throw when in the high power mode.

9. The PA system of claim 8 wherein the switching circuit is configured so that the second pole is in an open state when in the high power mode.

10. The PA system of claim 9 wherein the amplification stage of the second amplification path is configured to be disabled in the high power mode.

11. The PA system of claim 2 wherein the switching circuit is configured to connect the second pole to the selected output path through a corresponding throw when in the low power mode.

12. The PA system of claim 11 wherein the switching circuit is configured so that the first pole is in an open state when in the low power mode.

13. The PA system of claim 12 wherein each of the driver stage and the final stage of the first amplification path is configured to be disabled in the low power mode.

14. A method for amplifying a radio-frequency (RF) signal, the method comprising:
routing an input RF signal through a first amplification path having one or more PAs to generate a high power RF signal when in a high power mode;
routing the input RF signal through a second amplification path having one or more PAs to generate a low power RF signal when in a low power mode, the second amplification path different than the first amplification path; and
performing a switching operation to route the high power RF signal from the first amplification path through a first pole or the low power RF signal from the second amplification path through a second pole to a selected output path among a plurality of output paths corresponding to a plurality of operating bands.

15. A power-amplifier (PA) module comprising:
a packaging substrate configured to receive a plurality of components; and
a power amplifier (PA) system implemented on the packaging substrate, the PA system including a first amplification path having one or more PAs configured to generate a high power radio-frequency (RF) signal from an input RF signal when in a high power mode, and a second amplification path having one or more PAs configured to generate a low power RF signal from the input RF signal when in a low power mode, the second amplification path different than the first amplification path, the PA system further including a routing circuit configured to receive and route the input RF signal to the first amplification path or the second amplification path, the PA system further including a switching circuit having a first pole coupled to the first amplification path and a second pole coupled to the second amplification path, the switching circuit configured to route the high power RF signal through the first node or the low power RF signal through the second node to a selected output path among a plurality of output paths corresponding to a plurality of operating bands.

16. The PA module of claim 15 wherein the one or more PAs of the first amplification path, the one or more PAs of the second amplification path, and the switching circuit are implemented on a common semiconductor die.

17. The PA module of claim 15 wherein the one or more PAs of the first amplification path and the one or more PAs of the second amplification path are implemented on a first semiconductor die, and the switching circuit is implemented on a second semiconductor die.

* * * * *